United States Patent [19]

Yamada et al.

[11] Patent Number: 4,689,586
[45] Date of Patent: Aug. 25, 1987

[54] SURFACE ELASTIC WAVE DEVICE

[75] Inventors: Jun Yamada, Yokohama; Akitsuna Yuhara, Kawasaki; Takashi Shiba, Yokosuka; Yuji Fujita, Yokohama, all of Japan

[73] Assignee: Hitachi, Ltd., Tokyo, Japan

[21] Appl. No.: 869,979

[22] Filed: Jun. 2, 1986

[30] Foreign Application Priority Data

Jun. 7, 1985 [JP] Japan .............................. 60-122454
Jun. 19, 1985 [JP] Japan .............................. 60-131741

[51] Int. Cl.$^4$ ...................... H03H 9/145; H03H 9/42
[52] U.S. Cl. .................................. 333/151; 333/153; 333/154; 333/194; 310/313 D
[58] Field of Search ................. 333/150–155, 333/193–196; 310/313 R, 313 A, 313 B, 313 C, 313 D

[56] References Cited

U.S. PATENT DOCUMENTS

| | | | |
|---|---|---|---|
| 4,422,000 | 12/1983 | Yamada et al. | 310/313 B X |
| 4,516,093 | 5/1985 | Nyffeler | 333/196 X |
| 4,602,228 | 7/1986 | Yamada | 333/194 |

OTHER PUBLICATIONS

Yamada et al–"Relation of the Insertion Loss and Triple Transit Echo in SAW Unidirectional Transducers", Japanese Journal of Applied Physics, vol. 22 (1983), Supplement 22-3; pp. 163–164.
Miller et al–"A Comparison of Feeding Techniques for Group-Type Unidirectional Transducers", IEEE 1981 Ultrasonics Symposium; pp. 1–6.
Japanese Unexamined Utility Model Application No. 3614/1983 (1983); 2 pages.

*Primary Examiner*—Marvin L. Nussbaum
*Attorney, Agent, or Firm*—Antonelli, Terry & Wands

[57] ABSTRACT

A surface acoustic wave (SAW) device comprises a piezo-electric surface acoustic substrate, and plural sets of input/output interdigital electrodes disposed on the substrate. A phase shifter is provided between a sending electrode and a reflecting electrode included in the input or output interdigital electrodes for producing an electrical phase difference to implement a unidirectional electrode. The sending electrode and the reflecting electrode are mutually connected through the phase shifter including two pure reactance elements serially connected between the sending and the reflecting electrodes and a pure reactance element connected to the junction between the two serially connected reactance elements so as to form a T-circuit. When the two serially connected pure reactance elements are selected equal to each other, the operating frequency band is broadened. The phase shifter includes no ohmic resistance and thus is lossless.

10 Claims, 14 Drawing Figures

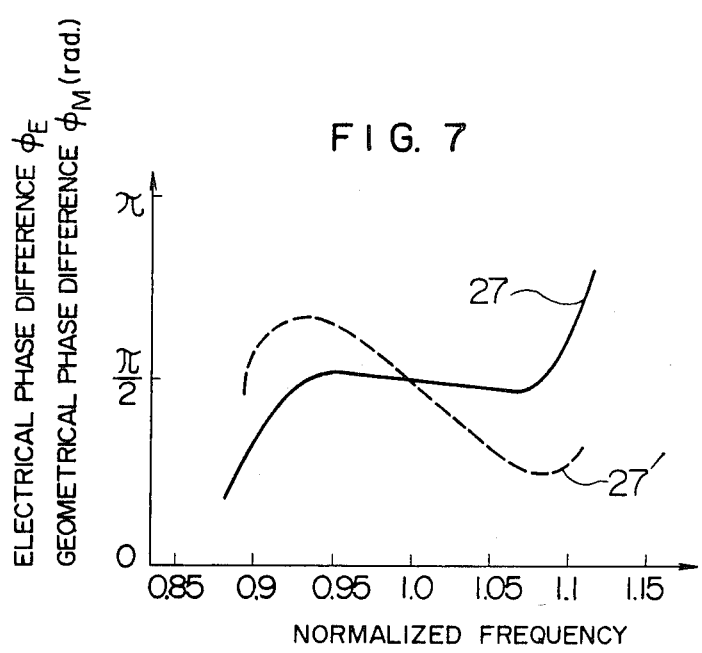

SURFACE ELASTIC WAVE DEVICE

BACKGROUND OF THE INVENTION

The present invention relates to a surface elastic or surface acoustic wave (SAW) device which exhibits improved characteristics in the respects of low loss and reduced distortion in the amplitude/phase frequency characteristics over a wide band width.

Concerning a unidirectional electrode device, there has been reported "a flat-amplitude surface acoustic wave filter incorporating a group-based unidirectional interdigital electrode array" designed so as to exhibit low loss and reduced ripple by making use of the unidirectional electrodes. By way of example, reference may be made to "A Collection of Lectures 1-5-14" of Japan Acoustic Academy (by Toshiyasu Meguro et al, Dec., 1976).

In the unidirectional electrode device, an electric phase difference is imparted between two or more input or output electrode groups so that the unidirectional propagation is realized through the interaction of an input or output acoustic wave with geometrical phase difference, to thereby achieve reduction in loss. In the case of the unidirectional electrode device, electric energy inputted to an electrical terminal is converted into surface acoustic wave energy radiated in the direction (forward direction) toward the oppositely disposed input or output interdigital electrode group and/or into a surface acoustic wave radiated in the direction (reverse direction) away from the opposite electrode group. In the course of the following description, the ratio of energy radiated in the reverse direction to that of the forward direction will be defined as a parameter a representative of the directivity, as in the case of Yamada et al's article entitled "Relation of the Insertion Loss and the Triple Echo in SAW Unidirectional Transducer" contained in "JJAP", Vol., 22-3 (1983) suppl. pp. 163-164. More specifically, when the parameter a is "0", this means perfect unidirectional propagation while the parameter a of "1" represents bidirectional propagation.

Heretofore, in the unidirectional electrode device of this type, it is a common practive in the designing that the input or output conductance Ga of a phase shifter circuit and the interdigital electrodes is made to match with an external load conductance Gl at the center frequency and that the directional parameter a is selected as small as possible over a broad band width. However, such design conditions were not necessarily the best conditions, as will be made apparent hereinafter, when considering the characteristics over the whole band.

In the case of the exemplary device disclosed in the aforementioned article, the electrical phase difference provided between the sending electrode and the reflecting electrode for realizing the unidirectional propagation is generated by means of a so-called Bessel type phase shifter which includes resistance elements and inductance elements. Although the Bessel type phase shifter can enjoy the facility in the designing because it requires only two types of circuit elements for construction, the phase shifter suffers a drawback in that the range in which the unidirectional propagation can be obtained in extremely narrow, as a result of which the ripple component is significantly increased at the frequencies deviated from the center frequency.

For having a better understanding of the present invention, discussion will hereat be made on the frequency characteristics of the unidirectional electrode device in which the aforementioned Bessel type phase shifter composed of resistance elements r and inductance elements L is employed. FIG. 11 of the accompanying drawings shows an equivalent circuit of a hitherto known unidirectional electrode device. Refering to the figure, a reference numeral 1 denotes a sending electrode including a resistor 4 and a capacitor 5 and a numeral 2 denotes a reflecting electrode including a resistor 4' and a capacitor 5', wherein the inter-center distance between these electrodes is so selected that the geometrical phase difference $\phi_M$ is equal to $(2m\pm\frac{1}{2})$ where m=2, 3, ..., while a phase shifter 3 as employed is so designed that the electrical phase difference $\phi_E$ at the center frequency is equal to $-(\pi/2)$. FIG. 9 of the accompanying drawings graphically illustrates the loss and frequency characteristics of this unidirectional electrode device. It will be seen that at the center frequency where the conditions for realizing the unidirectional propagation as described hereinafter are satisfied, the directivity (i.e. the ratio of energy propagating in the forward direction as represented by a curve 20 to the energy propagating in the reverse direction as represented by a curve 21') is very significant, while the directivity becomes reduced as the frequency is deviated from the center frequency, resulting in that the ripple component is increased due to the interelectrode multiple reflections or triple transit echo (hereinafter also referred to simply as TTE). FIG. 12 graphically illustrates a relationship between the directivity and the suppression of the TTE. It will be seen that the TTE can be more suppressed as the directivity is increased. In order to realize the TTE suppression of more than 40 dB, the directivity is required to be more than 20 dB, inclusive. In the hitherto known device shown in FIG. 11, the conditions for realizing the unidirectional propagation are given by the equations mentioned below on the assumption that $\phi_M$ represents a geometrical phase leading of the sending electrode 1 relative to the reflecting electrode 2 and that $\phi_E$ represents an electrical phase leading of the electrode located remotest from a power supply source.

$$\phi_M + \phi_E = 2\pi, 4\pi, \tag{1}$$

$$\phi_M - \phi_E = \phi, 5\phi, \tag{2}$$

$$|V_1| = |V_2| \tag{3}$$

where a symbol $V_1$ represents the voltage of the sending electrode and $V_2$ represents the voltage of the reflecting electrode. The frequency dependencies of the geometrical phase difference $\phi_M$, the electrical phase difference $\phi_E$ and the ratio $|V_2|/|V_1|$, respectively, can be given by the following equations:

$$\phi_M = (2m\pm\frac{1}{2})\pi(f/f_o) \tag{4}$$

where m represents a natural number $$\phi_E = -\pi/2 - 2(1+rG)(\delta f/f_o) \tag{5}$$

$$|V_2|/|V_1| = 1 + (\delta f/f_o) \tag{6}$$

It will be seen that both of the Equations (4) and (5) are linear approximations of the frequency deviation ($\delta f = f - f_o$). FIG. 7 graphically illustrates the frequency characteristics of the geometrical phase difference and the electrical phase difference on the assumption that $\phi_M=2.5\pi(f/f_o)$, the ratio between the radiation conductance and the capacitive susceptance of electrode is equal to 1 (unity) and that $\phi_E=-(\pi/2)-(2\delta f/f_o)$. When the Equations (2) and (3) are satisfied and unless the surface acoustic wave propagates in the reverse direction, the directivity can be remarkably increased. However, in the case of the hitherto known phase shifter, $\phi_M-\phi_E=3\pi+(2.5\pi+2)(\delta f/f_o)$
Thus, the deviation from the value given by the Equation (2) will become steeply increased, as the frequency is deviated from the center frequency.

As will be seem from the foregoing description, the hitherto known phase shifter suffers a drawback in that the frequency range in which the unidirectional propagation can be obtained is extremely restricted, involving a great difficulty in realizing the reduction of ripple over a broad band width. Further, a surface acoustic wave device in which a delay line circuit is employed in place of the phase shifter in an effort to increase the directivity has been reported by R. L. Miller et al (reference may be made to "IEEE, Ultrasonics Symposium Processings", pp. 1-6). However, the delay line is expensive and impractical.

As the phase shifter in which no resistor is employed, there is disclosed in Japanese Unexamined Utility Model Application Publication No. 3614/1983 a phase shifter in which a variable capacity diode is used in combination with a reactance circuit. It is however noted that no consideration is taken as to the frequency band characteristics of the circuit or apparatus to be connected to the phase shifter, not to say of the suggestion for improving the frequency characteristics over a broad band width.

SUMMARY OF THE INVENTION

An object of the present invention is to provide a surface acoustic wave device in which distortion of the amplitude and phase characteristics can be suppressed to a possible minimum and in which improved characteristics can be obtained with a reduced loss over a wide frequency band.

In view of the above and other objects which will be more apparent as description proceeds, it is proposed according to an aspect of the present invention that a relationship between the matching conditions and the parameter a representative of the directivity in a unidirectional electrode device is so determined that $a=(Gl-Ga)/(Gl+Ga)$ is met to suppress the triple transit echo ro TTE over the whole band.

According to another aspect of the present invention, it is taught that a sending electrode is connected in cascade to a reflecting electrode through a phase shifter which includes a serial connection of two pure reactance elements $(X_1, X_3)$ inserted between both the electrodes and a pure reactance element $(X_2)$ connected to the intermediate junction between the two reactance elements so as to form a T-circuit, to thereby obtain the unidirectional propagation over a wide band.

According to another aspect of the invention, it is taught to arrange the phase shifter in such a manner in which frequency deviations of the geometrical phase difference and the electrical phase difference are mutually canceled out for the wave propagation in the reverse direction so that the propagation of the surface acostic wave in the reverse direction is prevented from being increased notwithstanding of deviation from the center frequency, while a lumped parameter line including resistors, inductors and capacitors is provided to make variable the frequency characteristics for the purpose of maximizing the directivity.

BRIEF DESCRIPTION OF THE DRAWINGS

FIG. 7 is a characteristic diagram for graphically illustrating the change of electrical phase difference as a function of frequency;

DESCRIPTION OF THE PREFERRED EMBODIMENTS

Figure 1:
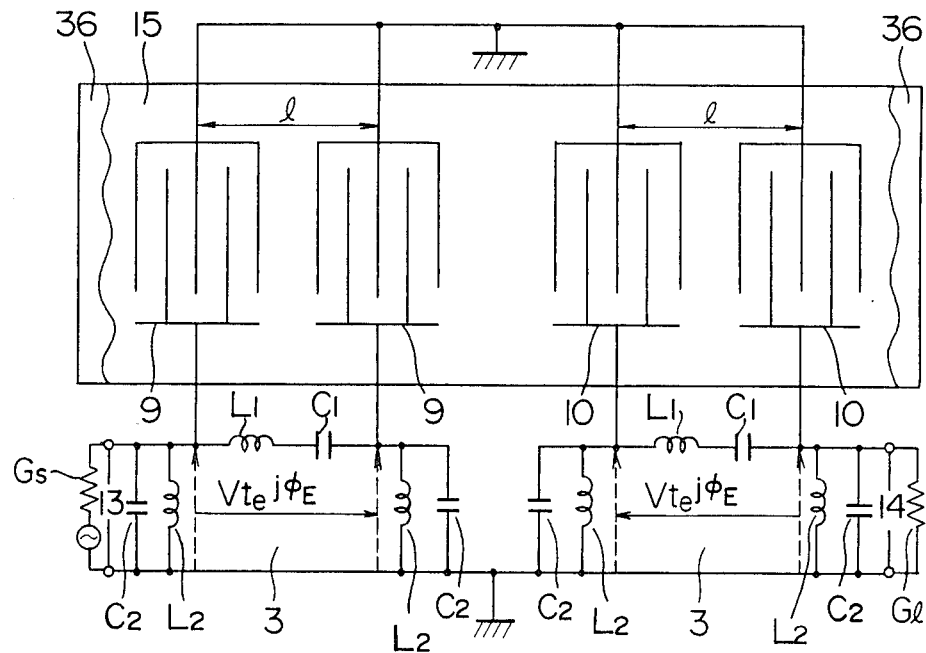
FIG. 1 is a circuit diagram showing a unidirectional electrode apparatus including phase shifters according to an exemplary embodiment of the present invention.

An unidirectional electrode device according to an exemplary embodiment of the present invention will be described by referring to FIG. 1. There are disposed on a surface acoustic wave substrate 15 groups of interdigital input electrodes 9 and interdigital output electrodes 10 with a geometrical phase difference $\phi_M(=2\pi \cdot 1/\lambda)$ between the electrode groups 9 and 10, where l represents a distance between the interdigital electrodes in each electrode group, and $\lambda$ represents the wavelength of the surface acoustic wave. Inductance elements $L_1$ and $L_2$ as well as capacitance elements $C_1$ and $C_2$ which cooperate to constitute a phase shifter circuit 3 for each electrode group are so selected that an electrical phase difference $\phi_E$ and a voltage ratio $V_t$ are established between the spaced interdigital electrodes of each group 9, 10. In that case the paramenter a indicative of the directivity is given by $$a = \frac{1 + V_t^2 + 2V_t \cos(\phi_M + \phi_E)}{1 + V_t^2 + 2V_t \cos(\phi_M - \phi_E)} \quad (7)$$

It should be noted that a surface acoustic wave absorber 36 is applied on each of the end faces of the substrate for suppressing the reflection therefrom.

Figure 2:
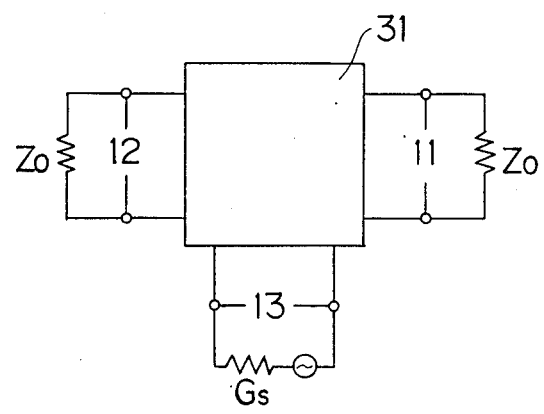
FIG. 2 is an equivalent circuit diagram of FIG. 1.

The input unidirectional electrode array 9 combined with the phase shifter circuit 3 composed of the elements $L_1, C_1, L_2$ and $C_2$ can be represented by an equivalent three pair ported network 31 having two pairs of mechanical (acoustic) ports 11 and 12 and a pair of electrical ports 13, as is shown in FIG. 2. Mechanical characteristic impedances $Z_o$ are coupled to the mechanical ports 11 and 12, respectively, while a power source conductance $G_s$ is coupled to the electrical port 13 for establishing a scattering matrix, to thereby determine a relationship between the directivity and the reflection at the mechanical port.

Assuming that loss is zero and the elements of the scattering matrix are real, $$|S_{11}|^2 + |S_{12}|^2 + |S_{13}|^2 = 1$$

$$|S_{21}|^2 + |S_{22}|^2 + |S_{23}|^2 = 1$$

$$|S_{31}|^2 + |S_{32}|^2 + |S_{33}|^2 = 1$$

Because $S_{ij} = S_{ji}$ (reversible) and because of the lossless assumption, $S_{11} S_{13} + S_{12} S_{23} + S_{13} S_{33} = 0$. Since the loss is due to the mismatch in the circuit system under consideration, $$|S_{13}|^2 + |S_{23}|^2 = \frac{4b}{(b+1)^2}$$

on the condition that $b = G_s/G_a$. The directivity a is given by $$a = \frac{|S_{23}|^2}{|S_{13}|^2} \tag{8}$$

Accordingly, $$|S_{13}|^2 + a|S_{13}|^2 = \frac{4b}{(b+1)^2}, \quad |S_{33}|^2 = \frac{(b-1)^2}{(b+1)^2} \tag{9}$$

$$|S_{13}|^2 = \frac{1}{1+a} \cdot \frac{4b}{(b+1)^2}$$

$$S_{13} = \pm \sqrt{\frac{4b}{1+a}} \cdot \frac{1}{(b+1)}$$

$$S_{23} = \pm \sqrt{\frac{4ab}{1+a}} \cdot \frac{1}{(b+1)}$$

$$S_{33} = \pm \frac{b-1}{b+1}$$

$$S_{11} + S_{12} \sqrt{a} \pm \frac{b-1}{b+1} = 0$$

$$S_{12} = \left( \mp \frac{b-1}{b+1} - S_{11} \right) \frac{1}{\sqrt{a}}$$

$$S_{11} = \frac{a - (b-1)/(b+1)}{a+1}$$

$$|S_{11}|^2 = \frac{(a-r)^2}{(a+1)^2}$$

where $$r = \frac{b-1}{b+1} \tag{10}$$

$$b = G_s/G_a \tag{11}$$

The above calculations are based on the assumption that the equivalent circuit 31 is passive and lossless and that the individual elements of the scattering matrix are real numbers. However, in the practical design, it is common that the loss in the phase shifter circuit is taken sufficiently small for the radiation energy. Further, because the composite susceptance of the device and the load on the side of the electrical port in a desired frequency band is also taken sufficiently small for the value of $G_a$, the assumption mentioned above holds valid.

Figure 3:
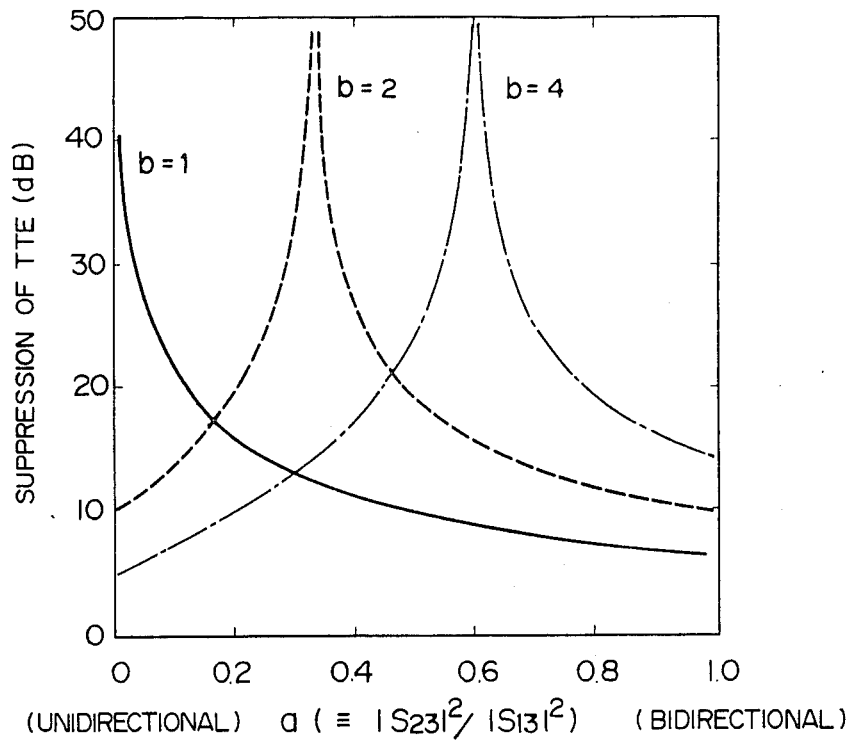
FIG. 3 is a characteristic diagram illustrating graphically a relationship between the directivity and suppression of TTE.

The wave reflected at the mechanical port represented by $|S_{11}|^2$ undergoes multiple reflection between the input and the output interdigital electrodes and makes appearance as an undesirably delayed signal at the output port or terminal, giving rise to ripples in the amplitude and phase characteristics over the frequency band. The multiple reflection is commonly referred to as the triple transit echo (or simply as TTE). FIG. 3 graphically illustrates the relationships between the parameter a and the suppression of TTE as determined on the basis of the Equation (9). It will be seen that the directivity $a_m$ which minimizes TTE is a function of b and given by $$a_m = r = \frac{b-1}{b+1} \tag{12}$$

Although $G_s$ is substantially constant over the desired band width, the factor $G_a$ is a function of frequency. Consequently, when the parameter a indicative of the directivity is rather approximated to the value given by the equation (12) than zero (0) in the desired band, it is possible to suppress the triple transit echo or TTE. By way of example, when the desired inter-electrode TTE suppression ratio in one of the input and output interdigital electrode groups is selected to be $1/c^2$, the directivity parameter a over the whole band is given from the equation (3) as follows:

$$\frac{rc-1}{c+1} \leq a \leq \frac{rc+1}{c-1} \tag{13}$$

With the parameter a determined above, the reflection wave within the band can be suppressed to a value smaller than the desired ratio of suppression.

In this manner, although it has heretofore been considered that the suppression of TTE can be achieved by making the parameter a representative of the directivity within the band be as small as possible and by setting $G_a = G_s$ at the center frequency, it has however been discovered that in actuality, the suppression of TTE over the whole band can be accomplished by selecting the directivity so as to satisfy the Equation (13).

It should also be noted that when $G_s$ is replaced by a load conductance Gl added to the output port 14, the loss and TTE in the output interdigital electrode group 10 can be dealt with in a similar manner.

Figure 4:
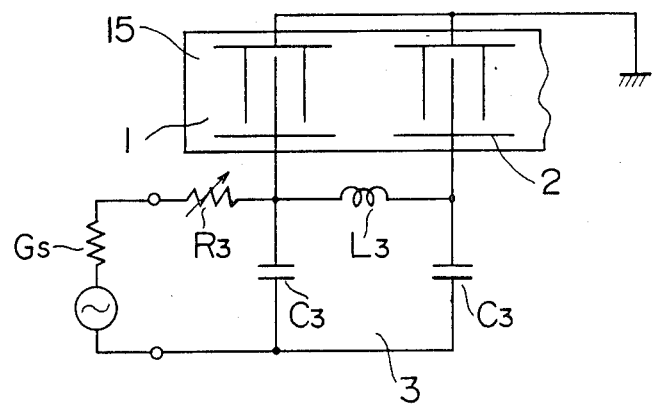
FIG. 4 is a schematic diagram of a unidirectional electrode device according to the invention.

FIG. 4 schematically shows a unidirectional electrode device according to an embodiment of the present invention in which the interdigital electrodes are disposed in a grouped unidirectional normalized electrode array including ten groups each of two pairs, wherein the input and output electrodes are realized in the identical structure. In each group, the geometrical phase difference between the interdigital electrodes 1 and 2 is selected to be $\pi/2$. The substrate is formed of a 128°—rotated Y-cut and X-propagating LiNbO$_3$ monocrystal. The center frequency is selected at 100MHz. The film thickness of the aluminium electrode is 5000Å. As to the constants for the phase shifter, selection is made such that $C_3=1$ pF, and $L_3=220$ nH. Power source resistance and the load resistance G1 are both about 29 mS.

Figure 5:
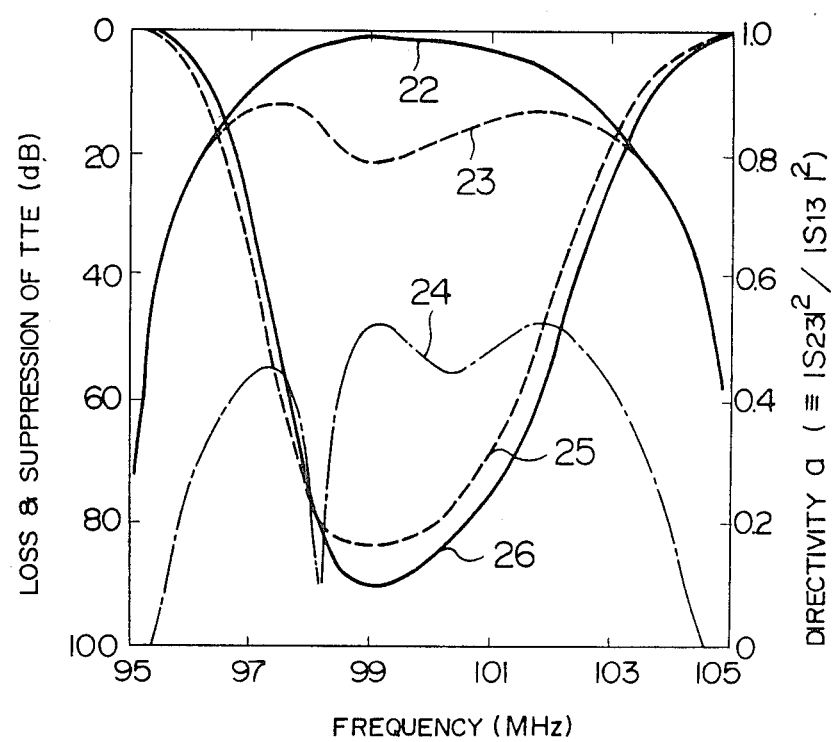
FIG. 5 is a diagram for illustrating graphically frequency characteristics of the circuit shown in FIG. 1.

FIG. 5 is a diagram for graphically illustrating the frequency characteristics of the SAW device incorporating the phase shifter according to the embodiment of the invention shown in FIG. 1. The interdigital electrode is of the same structure as in the case of the aforementioned embodiment. The constants of the phase shifter are selected such that $L_1=1.3$ μH, $L_2=230$ nH, $C_1=2.2$ pF, and $C_2=2$ pF. With this arrangement, it is possible to make the parameters $a_{m25}$ and $a_{m26}$ approximate to each other without need for the variable resistor $R_3$. More specifically, referring to FIG. 5, a curve 22 represents loss in the forward direction, a curve 23 represents loss in the reverse direction, and a curve 24 represents suppression of TTE, wherein a curve 25 shows the parameter $a_{25}$ indicative of the directivity ensuring the maximum suppression of TTE, and a curve 26 shows the actually measured values of the parameter $a_{26}$ indicative of the directivity. In the case of the instant embodiment, the variable resistor $R_3$ is not used, as the result of which loss can be improved to less than 3 dB, while TTE can be suppressed more than 44 dB over the whole band width. The amplitude ripple is 0.1 dB peak-to-peak (p-p), and the group delay time ripple is 11 $nS_{p-p}$.

The foregoing description has been made of the grouped unidirectional electrode array. However, it goes without saying that the unidirectional electrode array of three-phase excitation type or the like can also enjoy the similar advantages by designing so that the conditions given by the Equation (7) can be satisfied.

Figure 6A:
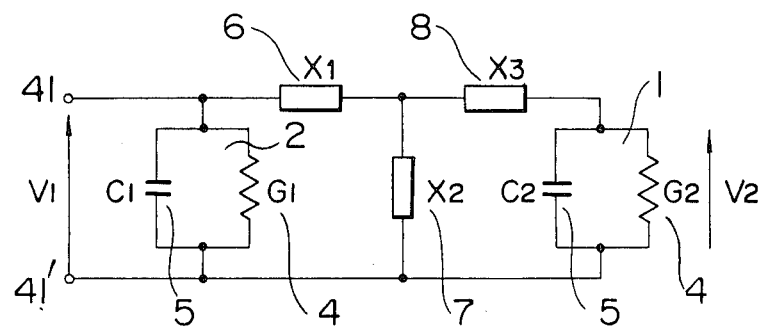
FIGS. 6a and 6b are diagrams showing an equivalent circuit and a configuration of a unidirectional electrode device including a phase shifter according to another embodiment of the invention, respectively.

FIG. 6a shows an equivalent circuit of a unidirectional electrode device including a phase shifter at the center frequency according to another embodiment of the present invention. The unidirectional electrode array includes a set of sending and reflecting electrodes, wherein each of these interdigital electrodes can be represented by an equivalent parallel connection of radiation conductance G and electric capacitance C. In the figure, $G_2$ denoted by a numeral 4 and $C_2$ denoted by 5 represent the sending electrodes 1, respectively, while $G_1$ denoted by 4 and $C_1$ denoted by 5 represent the reflecting electrodes 2, respectively. The phase shifter is constituted by a T-circuit composed of reactance elements 6, 7 and 8 having values $X_1$, $X_2$ and $X_3$, respectively. The sending electrode and the reflecting electrode are mutually connected in cascade by way of the phase shifter. Assuming that the voltage appearing across the input terminals 41 and 41' is represented by $V_1$ with the voltage appearing across the sending electrode being represented by $V_2$ and that the phase difference between both voltages as brought about by the phase shifter is represented by $\phi_E$ (hereinafter the angle will be given in radian), the conditions for realizing $V_1=V_2.e^{j\phi}E$ are as follows:

$$\left(\frac{X_1}{X_2} + 1\right) \cdot (1 - \omega_o C_2 X_3) - \omega_o C_2 X_1 = \cos \phi_E \quad (14)$$

$$\left(\frac{X_1}{X_2} + 1\right) \cdot G_2 X_3 + G_2 X_1 = \sin \phi_E \quad (15)$$

where $$X_2 \neq 0 \quad (16)$$

The values of $X_1$, $X_2$ and $X_3$ which can satisfy the above conditions are determined. For the positive values of $X_1$, $X_2$ and $X_3$, the phase shifter is constituted by inductance elements. On the other hand, the phase shifter is constituted by capacitance elements for the negative values of $X_1$, $X_2$ and $X_3$. Since the phase shifter includes no resistance element, the phase shifter can be made lossless.

As will be readily appreciated, the values of $X_1$, $X_2$ and $X_3$ can not be definitely determined under the aforementioned conditions, but a freedom remains in design. Experiments conducted by the inventors has shown that variation or change in the electrical phase difference $\phi_E$ in dependence on the frequency can be minimized by selecting the values of $X_1$ and $X_3$ such that $X_1=X_3$. The above description has been based on the assumption that the electrodes are of a normalized type. In this connection, it will be understood that the value of the parameter a which can ensure the constant electrical phase difference over a wide range is not necessarily "1", but may be selected to assume an appropriate value, when the change in the radiation conductance varies due to weighting or the like modification. More specifically, the element constants $X_1$, $X_2$ and $X_3$ are so determined that the electrical phase difference given by the arctangent derived from the Equations (14) and (15) is constant. On the condition that $X_3=X_3$, from the Equations (14) and (15), $$X_1 = X_3 = \frac{1}{\omega_0 C_2 + G_2} \quad (17)$$

$$X_2 = \frac{G_2}{\omega_0^2 C_2^2 - G_2^2} \quad (18)$$

At that time, the input admittance $Y_0$ of the device as observed from the port 1—1' is given by $$Y_0 = 2G_2 \quad (19)$$

Thus, the electrical phase difference of $\pi/2$ is obtained and at the same time a complex conjugation matching can be accomplished. On these conditions, the electrical phase difference $\phi_E$ at the center frequency is $\pi/2$, and the change thereof as a function of the frequency is such as represented by a curve 27 shown in FIG. 7. The phase shifter constituted only by the reactance elements according to the teachings of the present invention brings about an improved and novel effect that the phase difference $\phi_E$ assumes a constant value of $\pi/2$ over a wide frequency band, as will be understood by comparing the solid curve 27 with a broken curve 27' representing the corresponding change of the electrocal phase difference in the hitherto known Bessel type phase shifter.

On the other hand, when $X_3=0$ in the Equations (14) and (15), $$X_1 = \frac{\sin \phi_E}{G_2} \tag{20}$$

$$X_2 = \frac{\sin \phi_E}{\omega_0 C_2 \sin \phi_E - G_2(1 - \cos \phi_E)} \tag{21}$$

Thus, the phase shifter can be realized by using only two reactance elements. In this case, however, the values of the two reactance elements are determined definitely. Although there may arise a case in which the change of the electrical phase difference $\phi_E$ in dependence on the frequency is not so small as in the case of the phase shifter constituted by three elements, loss of the two-element phase shifter can be lowered significantly when compared with the Bessel type phase shifter.

Figure 6B:
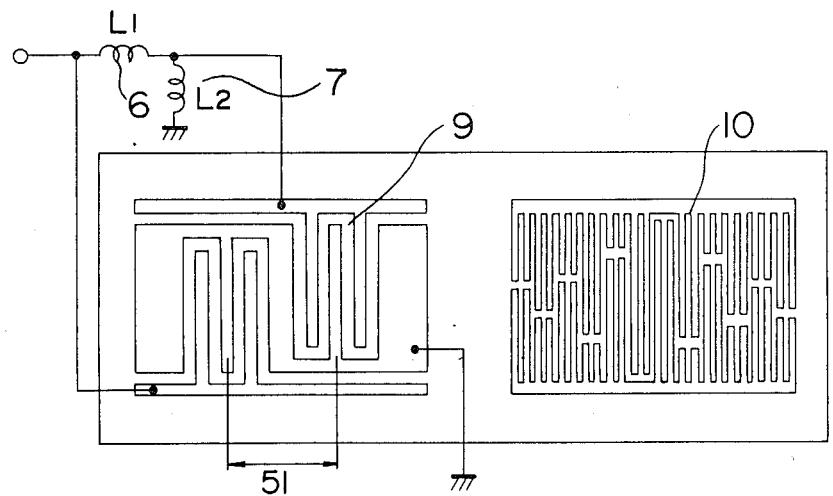

FIG. 6b shows another embodiment of the invention applied to a surface acoustic wave device employed in an intermediate frequency stage of a color television receiver. The piezo-electric substrate, the electrode material and the electrode film fabricating process are same as those described hereinbefore in conjuncion with the first embodiment of the invention. The center frequency is 56.5 MHz, and the input electrodes 9 are realized in a grouped unidirectional electrode array including five groups each of four pairs of electrodes. The inter-center distance 51 is selected to be 154.5 μm so that the geometrical phase difference is $\pi/2$. The output electrodes comprise 40 pairs of weighted electrodes of duplicated structure. Aperture length of the electrode is 1000 μm. The radiation conductances $G_1$ and $G_2$ of the input electrodes (including, sending electrodes and reflecting electrodes) are so selected that $G_1 = G_2 = 2.3$ mS while the capacitance is selected to be 9.3 pF. The phase shifter is constituted by two inductors $L_1$ and $L_2$, wherein $L_1$ and $L_2$ are selected equal to 1.2 μH and 2.8 μH, respectively, to realize the electrical phase difference of $\pi/2$. In the figure, numerals 6 and 7 denote $L_1$ and $L_2$, respectively. As the coupling conditions of the device, the drive impedance is set to 210 Ω with the load impedance being set to 120 Ω.

With the arrangement, a wide-band amplitude characteristic can be obtained. The triple transit echo or TTE can be suppressed to 45 dB while the group delay characteristic curve 25 is flat at 20 $nS_{p\text{-}p}$. Loss is 7.3 dB at the center frequency, which means an improvement of about 3.2 dB over the prior art phase shifter using a reactance and a resistance. By constituting the phase shifter with three pure reactance elements, a great freedom can be assured in design. The unidirectional propagation characteristics are obtained over a broad band width. The phase shifter is lossless. Thus, there can be realized a surface acoustic wave device which exhibits advantageous characteristics.

Figure 8A:
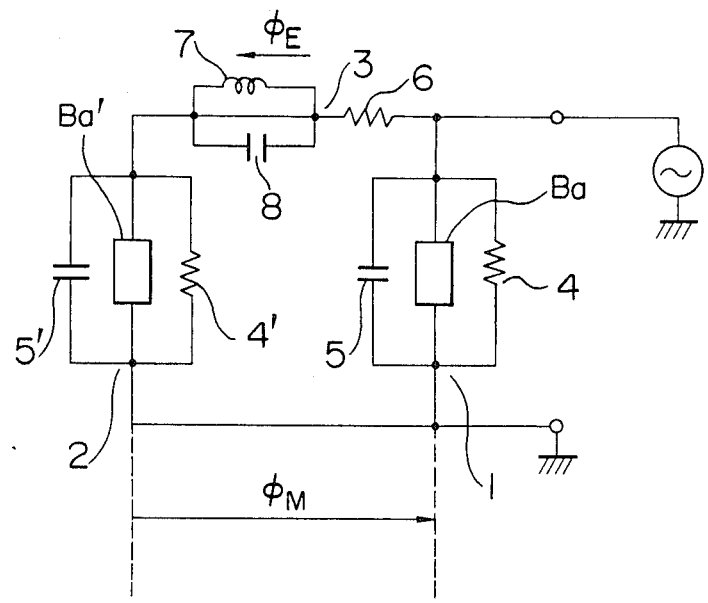
FIGS. 8a and 8b are diagrams of an equivalent circuit and a configuration of another embodiment of the invention, respectively.

FIG. 8a shows an equivalent circuit diagram for illustrating the principle of a unidirectional electrode device incorporating a phase shifter according to another embodiment of the invention. Referring to the FIGURE, the unidirectional electrode array comprises a sending electrode 1 and a reflecting electrode 2. Each of the electrodes is represented by a parallel equivalent connection of radiation conductance (G)4, 4' capacitance (C)5, 5' and radiation susceptance $B_a$, $B_a'$. The phase shifter 3 is constituted by a resistor (R)6 connected in series to a parallel connection of an inductance ($L_m$)7 and a capacitance ($C_m$)8. The phase shifter 3 is connected in series to the reflecting electrode 2, wherein the series connection of the phase shifter 3 and the electrode 2 is connected in parallel with the sending electrode 1. With the arrangement, the conditions under which the electrical phase difference $\phi_E$ is equal to $-\pi/2$ (in radian) and $|V_1| = |V_2|$ at the center frequency of $f_o (= \omega_o/2\pi)$ are given by $$R = \frac{k-1}{k^2+1} \cdot \frac{1}{G} \tag{22}$$

$$\frac{\omega_o L_m}{1 - \omega_o^2 L_m C_m} = \frac{k+1}{k^2+1} \cdot \frac{1}{G} = u \tag{23}$$

where $k = \omega_o C/G$ \hfill (24)

Assuming that in the vicinity of the center frequency, $$B_a = C_A(\omega - \omega) = C_A \cdot 2\pi(f - f_o) \tag{25}$$

the relationship between the directivity and $C_m$, $L_m$ on the conditions which satisfy the Equations (22) and (23) is considered to determine the value of the circuit constants $C_m$ and $L_m$ so that the unidirectional propagation is enhanced.

The frequency characteristics of $|V_1|/|V_2|$ and $\phi_E$ in the vicinity of the center frequency $f_o$ are given by $$|V_1|/|V_2| = 1 + F \cdot \delta\omega',$$

and hence $$F = 1 + 2u^2 G\omega_o C_m + R\omega_o C_A \tag{26}$$

$$\phi_E = -\pi/2 - K\delta\omega',$$

and hence $$K = \omega_o C u \left\{ 2(1 + \omega_o C_m u) + \frac{C_A}{C} \right\} \tag{27}$$

on the assumption that $(\omega - \omega_o)/\omega_o = \delta\omega/\omega_o = \delta\omega'$. It should be mentioned that the value of $L_m$ does not make appearance positively in the Equations (26) and (27) since $L_m$ is determined as a relation to $C_m$.

Next forward excitation and reverse excitation will be considered. Magnitude of distortion of the surface acoustic wave is represented by $U_f$ in the forward direction and by $U_r$ in the reverse direction. Assuming the frequency response H(f) of the electrode is flat over the band width, $U_f$ if given by $$U_f = H(f) |V_2| \{e^{j\phi_E} + |V_1|/|V_2| e^{j\phi_M}\} \tag{28}$$

while $U_r$ is given by $$U_r = H(f) |V_2| \{e^{j\phi_E} + |V_1|/|V_2| e^{-j\phi_m}\} \tag{b 29}$$

The conditions for the unidirectional propagation are $|V_1| = |V_2|$ and that $$\phi_M - \phi_E = 2\pi, 4\pi, \tag{30}$$

$$\phi_M + \phi_E = \pi, 3\pi, \tag{31}$$

where the Equation (30) applied to the forward excitation with the Equation (31) applying to the reverse excitation.

For the geometrical phase difference $\phi_M = A(\omega/\omega_o)$, the most simplified case is given by $$A = (2m - \tfrac{1}{2})\pi, \quad m = 1, 2, \tag{32}$$

In the light of the Equations (26), (27), (28), (29) and (30), it will be seen that the Equations (30) and (31) can be perfectly satisfied at the center frequency. In the case where $A = (2m + \tfrac{1}{2})\pi$ the polarity of the reflecting electrode can be inverted for the processing in the same manner. In the forward direction, through the approximation of the normalized frequency deviation $\delta\omega'$ to the term of the first order, $$U_f \approx H(f)(-j)\left[(2 + F\delta\omega')\left(1 - j\frac{K-A}{2}\delta\omega'\right)\right] \tag{33}$$

$$\approx H(f)(-j)[2 + \sqrt{F^2 + (K-A)^2}\; e^{j\xi\delta\omega'}]$$

$$U_r \approx H(f)(-j)\left[(2 + F\delta\omega')j\frac{K-A}{2}\delta\omega' - R\delta\omega'\right] \tag{34}$$

$$\approx H(f)(-j)[-\sqrt{F^2 + (K-A)^2}\; e^{j\xi\delta\omega'}]$$

Assuming that $$\frac{U_f}{U_r} \approx -\frac{2}{\delta\omega'}\left[\frac{F + j(K-A)}{F^2 + (K-A)^2}\right] - 1$$

and that $$\frac{2}{\delta\omega'} > 1$$

$$\left|\frac{U_f}{U_r}\right| \approx \left(\frac{2}{\delta\omega'}\right)\frac{1}{\sqrt{F^2 + (K-A)^2}} \tag{35}$$

where $$\xi = \tan^{-1}\{-(K-A)/F\}$$

In combination with the Equations (26), (27) and (32), the directivity $|U_f/U_r|^2$ can be obtained by squaring the Equation (32). From the Equation (35), $C_m = C^M_m$ at which $|U_f/U_r|$ can be maximized is determined as follows:

$$C_m^M = \frac{1}{\omega_o}\cdot\frac{\{A - 2\omega_o Cu - \omega_o C_A u\}\omega_o C - (1 + R\omega_o C_A)G}{2u^2\{(\omega_o C)^2 + G^2\}} \tag{36}$$

Since the term within the root sign of the Equation (35) is a quadratic equation of $C_m$, the ratio $|U_f|/|U_r|$ is increased when $C_m = 0$ within the range defined by $0 < C_m < 2C^M_m$. When $C_m$ is further increased so that it can be given by $$C_m = C_m^A = \frac{1}{\omega_o}\cdot\frac{A - 2u\omega_o C - \omega_o C_A u}{2u^2\omega_o C} \tag{37}$$

then, $K = A$. This means that the rate of change in the electrical phase difference of the phase shifter 3 as a function of the frequency coincides with that of the geometrical phase difference. In contrast to the case of a delay line, the frequency characteristics reside in $|V_1|/|V_2|$ and is proportional to $C_m$ as will be seen from the Equation (26). Accordingly, the minimum value of $|U_f/U_r|$ of the Equation (35) can not be given. However, when compared with the directivity of the hitherto known phase shifter arrangement or the Bessel type phase shifter, which directivity is given by $$\left|\frac{U_f}{U_r}\right|^2 \approx \left\{\left(\frac{2}{\delta\omega'}\right)\frac{1}{\sqrt{F^2 + (K+A)^2}}\right\}^2 \tag{38}$$

the value of $|U_f|/|U_r|$ determined by the Equation (35) on the assumption that the $C_m$ is made equal to $C^A_m$ given by the Equation (37) and that $K = A$ is obviously greater than the value determined in accordance with the above Equation (38). Further, it will be seen that the value of $C^A_m$ represents a value approximating the upper limit of $C_m$ at which the value of $|U_f|/|U_r|$ is increased beyond those realized by the prior art phase shifter. Accordingly, the value $C^A_m$ pf $C_m$ given by the Equation (37) is selected as the upper limit for the practical purpose.

In the following, the invention will be compared with the prior art for the most simplified model in which $\omega_o C = G$, $R = 0$, $u = 1/G = 1/\omega_o C$ and $C_A = 0$.

In conjunction with the present invention, $C_m = (A-3)C/4$ given by the Equation (36) at which $|U_f|/|U_r|$ is at maximum is selected as the value of $C_m$. Then, $$F = (A-1)/2 \text{ and } K = (A+1)/2$$

Thus, the directivity $|U_f/U_r|^2$ is given by $$\left|\frac{U_f}{U_r}\right|^2 \approx \left\{\left(\frac{2}{\delta\omega'}\right)\frac{\sqrt{2}}{(A-1)}\right\}^2 \tag{39}$$

On the other hand, in the case of the prior art arrangement, assuming that $F = 1$ and $K = 2$, $$\left|\frac{U_f}{U_r}\right|^2 \approx \left\{\left(\frac{2}{\delta\omega'}\right)\frac{1}{\sqrt{1 + (2+A)^2}}\right\}^2 \tag{40}$$

In the case where $f_o = 600$ MHz, $\delta f = 15$ MHz and thus $\delta\omega' = \delta f/f_o = 1/40$ and the band width is 30 MHz, relations between the values of A and those of the directivity $|U_f/U_r|^2$ at the band sides are summarized in the following Table 1.

TABLE 1

| A | Directivity $|U_f/U_r|^2$ (dB) | | |
|---|---|---|---|
| | Invention | Prior Art | Difference |
| $3\pi/2$ | 29.7 dB | 21.4 dB | 8.3 dB |
| $5\pi/2$ | 24.4 dB | 18.1 dB | 6.3 dB |
| $7\pi/2$ | 21.1 dB | 15.8 dB | 5.3 dB |
| $9\pi/2$ | 18.7 dB | 13.9 dB | 4.8 dB |
| $11\pi/2$ | 16.8 dB | 12.3 dB | 4.5 dB |

As will be seen in the above Table, the present invention provides a significant improvement over the prior art.

In the basic structure according to another embodiment of the present invention, the phase shifter 3 may be constituted by a resistor R connected in series to a serial connection of an inductor $L_m$ and a capacitor $C_m$, as is shown in FIG. 8a. In the phase shifter, the conditions under which the electrical phase difference $\phi_E$ become equal to $-\pi/2$ and $|V_1| = |V_2|$ at the center frequency $f_o$ ($=\omega_o/2\pi$) are given by $$R = \frac{k-1}{k^2+1} \cdot \frac{1}{G} \tag{41}$$

$$\omega_o L_m - \frac{1}{\omega_o C_m} = \frac{k-1}{k^2+1} \cdot \frac{1}{G}$$

where $k = \omega_o C/G$. The circuit constants are determined in the same manner as described hereinbefore. The value of $C_m$ ($= C^M_m$) which can maximize the directivity $|U_f/U_r|^2$ is given by $$C_m{}^M = \frac{2\{(G/\omega_o)^2 + C^2\}}{\{A - (1 + RG)(2 + C_A/C)\}C - (1 + RC_A\omega_o)G/\omega_o} \tag{42}$$

The range of $C_m$ in which the directivity is improved over the prior art phase shifter arrangement and the Bessel type phase shifter is given by $$C_m \geq C_m{}^A = \frac{2C}{A - (2 + C_A/C)(1 + RG)} \tag{43}$$

Figure 8B:
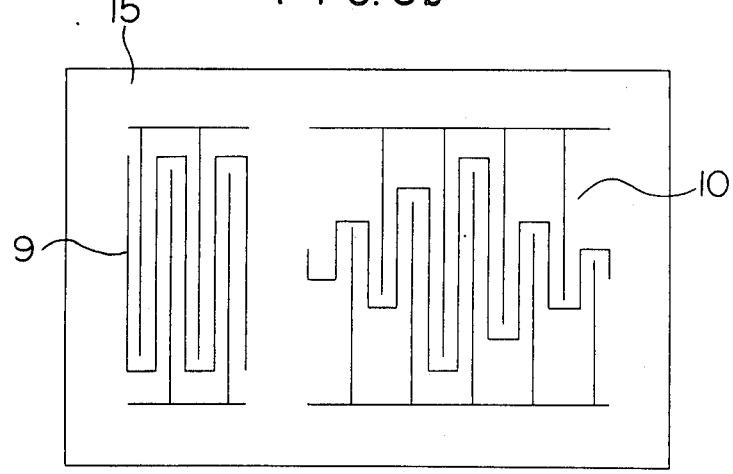

FIG. 8b shows a SAW device according to still another embodiment of the invention. The piezo-electric substrate 15 is formed of a 128° - rotated Y-cut and X-propagation $LiNbO_3$. The input electrodes are provided in 20 pairs and each constituted by a unidirectional electrode having a constant aperture length. The output electrodes are provided in 60 pairs, wherein the individual unidirectional electrodes are weighted by varying the width of intersection. The center frequency is 612 MHz. The line width of the electrode is 1.6 μm in the case of the solid electrode with the aperture length of the electrode being 1000 μm. These electrodes are formed of an aluminum film in thickness of 1000 Å through vapor deposition and subsequent photolithography.

Figure 9:
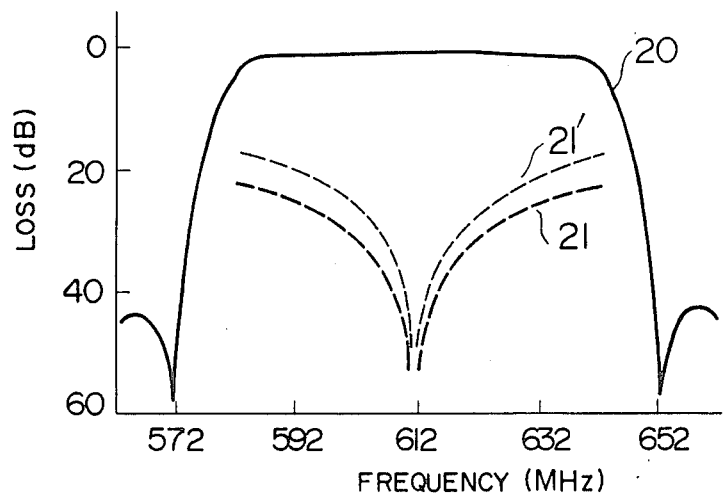
FIG. 9 is a characteristic diagram illustrating a relationship between loss and frequency.
Figure 10:
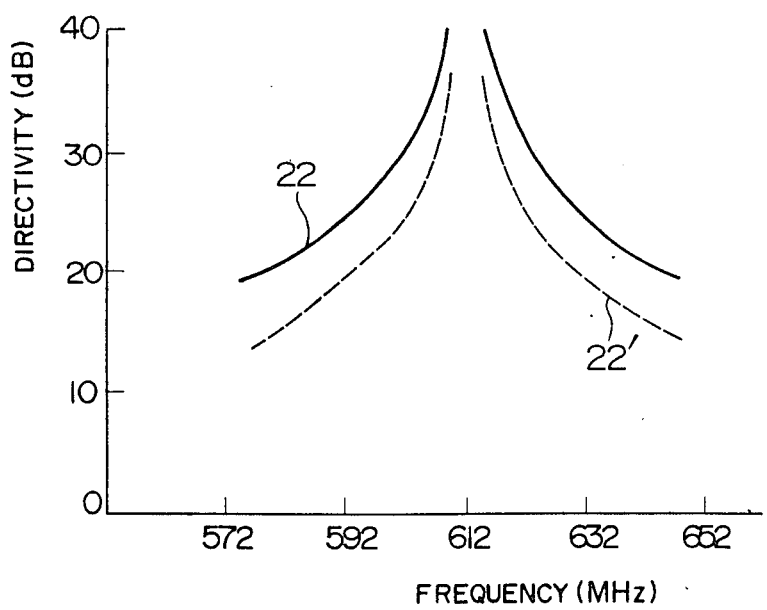
FIG. 10 is a characteristic illustrating a relation between the directivity and frequency.
Figure 11:
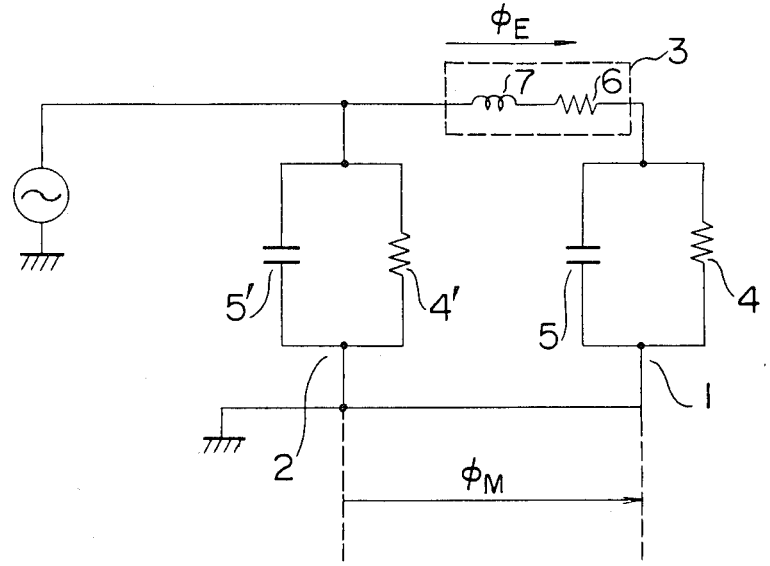
FIG. 11 is a circuit diagram showing a hitherto known unidirectional electrode device including a Bessel type phase phase shifter.
Figure 12:
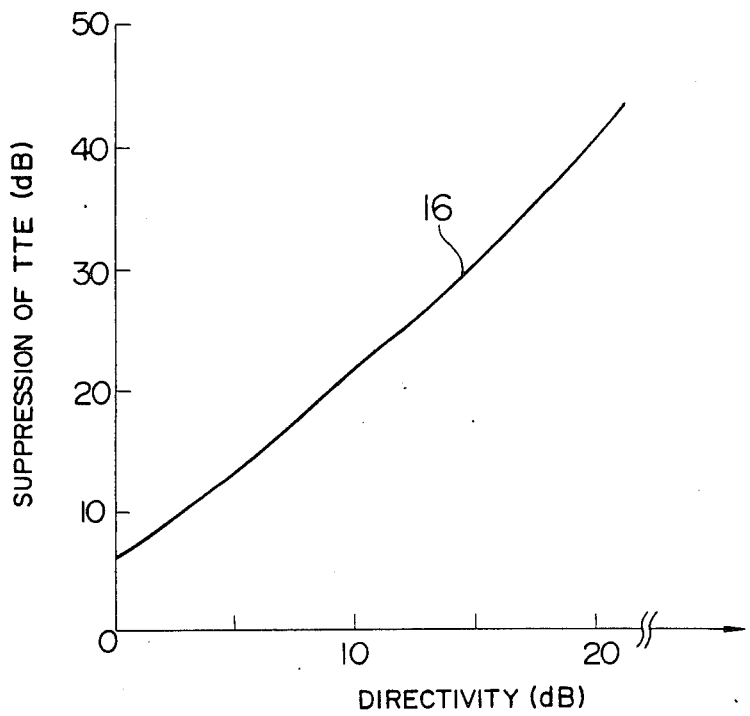
FIG. 12 is a diagram for graphically illustrating a relationship between the directivity and the suppression of TTE.

The radiation conductance G of the input electrodes is 9 mS and the capacitance C is 26 pF, while the output electrodes exhibit a radiation conductance G of 10 mS and a capacitance C of 34 pF. In the output electrode array, gradient ($C_A$) of the radiation susceptance in the vicinity of the center frequency is substantially zero. Constants of the phase shifter are so determined that the directivity becomes maximum on the basis of the Equations (36) and (23). When A is set equal to $7\pi/2$ in the geometrical phase difference $\phi_M = A(f/f_o)$ of the unidirectional sending and reflecting electrodes, then on the input side, $R = 9\Omega$, $L_m = 2$ nH and $C_m = 3$ pF, while on the output side, $R = 7\Omega$, $L_m = 2.1$ nH and $C_m = 1$ pF. FIG. 9 illustrates the frequency characteristic of the instant embodiment. In the figure, a curve 20 represents energy propagating in the forward direction, and a curve 21 represents energy propagating in the reverse direction. As will be seen in FIG. 9, the frequency characteristic scarcely containing ripple components is obtained over a broad band width. At the boundary of a band of ±15 MHz, the directivity is 21 dB, suppression of TTE is more than 40 dB, and loss is 1.2 dB. FIG. 10 shows comparatively the directivity 22 realized by the invention and that 22' of the hitherto known unidirectional electrode device. As is apparent from FIG. 10, the range in which the directivity can be enhanced is increased about twice as large as the range capable of being realized in the hitherto known device.

As will now be appreciated from the foregoing description, the invention has provided a surface acoustic wave device which can enjoy low ripple, low loss and other improved characteristics over a broad band width by employing a phase shifter of a very simplified structure which requires solely one resistor, one inductor and one capacitor.

We claim:

1. A surface acoustic wave (SAW) device, comprising: a piezo-electric surface acoustic wave substrate; an input transducer formed on said substrate and connected to a signal source, for conversion of an electrical signal from said signal source into a surface acoustic wave; an output transducer formed on said substrate and connected to a load circuit, for conversion of said acoustic wave into said electric signal; at least one of said input transducer and said output transducer including a sending electrode and a reflecting electrode and said reflecting electrode for producing electrically a phase difference therebetween; said device satisfying the following conditions:

$$Ga \neq Gl \quad a \neq 0$$

at a center frequency of a frequency band; and $$a = \frac{Gl - Ga}{Gl + Ga}$$

at a band frequency except for said center frequency; where a represents the ratio of energy radiated from said output transducer toward said input transducer to the energy radiated from said input transducer to said output transducer, Ga represents a composite conductance of said phase shifter and said transducer which include said sending electrode and said reflecting electrode, and Gl represents a load conductance externally coupled to said output transducer.

2. A surface acoustic wave device according to claim 1, wherein said phase shifter circuit includes an inductance element and a capacitance element connected in parallel with each other and inserted between each transducer on the ungrounded side and the ground, and a series connection of an inductance element and a capacitance element connected between said reflecting electrode and said sending electrode on the ungrounded side. electrical phase difference $\phi_E$, the following conditions are met:

$$\left(\frac{X_1}{X_2} + 1\right) \cdot (1 - \omega_o C_2 X_3) - \omega_o C_2 X_1 = \cos \phi_E$$

$$\left(\frac{X_1}{X_2} + 1\right) \cdot G_2 X_3 + G_2 X_1 = \sin \phi_E$$

$$X_2 \neq 0$$

where $\omega_o = 2\pi f_o$ $f_o$: center frequency of the surface acoustic wave device $G_2$: radiation conductance of the sending part $C_2$: electrical capacitance of the sending part.

3. A surface acoustic wave device, comprising: a piezo-electric surface acoustic wave substrate; a plurality of interdigital electrodes disposed on said substrate as input electrodes and output electrodes; at least one of said input electrodes and said output electrodes including a sending electrode and a reflecting electrode; and a phase shifter composed of a resistor, an inductor and a capacitor connected in series to one another and connected between said sending electrode and said reflecting electrode; wherein an electrical phase difference is produced between said sending electrode and said reflecting electrode by means of said phase shifter to implement a unidirectional electrode.

4. A surface acoustic wave device according to claim 3, wherein said resistor of a resistance R, said inductor of an inductance $L_m$ and said capacitor of a capacitance $C_m$ constituting said phase shifter satisfy the following conditions:

$$R = \frac{K-1}{K^2+1} \cdot \frac{1}{G}$$

$$\omega_o L_m - \frac{1}{\omega_o C_m} = \frac{K+1}{K^2+1} \cdot \frac{1}{G}$$

$$C_m > \frac{1}{\frac{4n-1}{2}\eta - \frac{K^2+K}{K^2+1}} \cdot \frac{B}{\omega_o}$$

where $K = B/G$ n: an integer $\omega_o$: $2\pi f_o$ $f_o$: center frequency of the surface acoustic wave device G: radiation conductance of the interdigital electrode B: susceptance of the interdigital electrode.

5. A surface acoustic wave device according to claim 4, wherein said capacitance $C_m$ constituting a part of said phase shifter satisfies the following equation:

$$C_m = \frac{1}{\frac{4n-1}{2} - \frac{k^2+k}{K^2+1}} \cdot \frac{2B}{\omega_o}$$

6. A surface acoustic wave device, comprising a piezo-electric acoustic wave substrate; a plurality of interdigital electrodes disposed on said substrate to serve as input electrodes and output electrodes; at least one of said input electrodes and said output electrodes including a sending electrode and a reflecting electrode; a phase shifter constituted by a parallel connection of an inductance element and a capacitance element and a resistor connected in series to said parallel connection, said phase shifter being coupled between said sending electrode and said reflecting electrode by means of said phase shifter to provide a unidirectional electrode.

7. A surface acoustic wave device according to claim 6, wherein said resistance element of a resistance R, said inductance element of an inductance $L_m$ and said capacitance element of a capacitance $C_m$ constituting said phase shifter satisfy the following conditions:

$$R = \frac{K-1}{K^2+1} \cdot \frac{1}{G}$$

$$\frac{\omega_o L_m}{1 - \omega_o^2 L_m C_m} = u = \frac{K+1}{K^2+1} \cdot \frac{1}{G}$$

$$C_m \leq \frac{1}{\omega_o} \cdot \frac{A - 2u\omega_o C - u\omega_o C_A}{2u^2 \omega_o C}$$

where $K = \omega_o C/G$

A: rate of change of geometrical phase difference $\phi_M$ between the sending electrode and the reflecting electrode as a function of frequency [$\phi_M = A \times (\omega/\omega_o)$]

$\omega_o$: $2\pi f_o$ $f_o$: center frequency of the surface acoustic wave device G: radiation conductance of the interdigital electrode C: capacitance of the interdigital electrode $C_A$: rate of change of susceptance of the interdigital electrode in the vicinity of the center frequency.

8. A surface acoustic wave device comprising:

a piezo-electric substrate;

an input transducer formed on said substrate and connected to a signal source, for conversion of an electrical signal from said signal source into a surface acoustic wave;

an output transducer formed on said substrate and connected to a low circuit, for conversion of said acoustic wave into said electric signal;

at least one of said input and output transducers including a sending part and a reflection part, and each part comprising a pair of interdigited comb shape arrays of electrically conductive fingers spaced on said substrate;

a first reactance element having a first end connected to a predetermined comb shape array of said sending part and a second end;

a second reactance element having a first end connected to said second end of said first reactance element and a second end connected to a predetermined comb shape array of said reflection part; and a third reactance element having a first end connected to said second end of said first reactance element and a second end connected to comb shape arrays of said sending and reflection parts other than said predetermined comb shape arrays.

9. A surface acoustic wave device according to claim 8, wherein two $X_1$, $X_3$ of said reactance elements constituting said phase shifter are connected in series to each other and inserted between said sending part and said reflecting part, while one $X_2$ of said reactance elements is connected to the junction between said two reactance elements; values of said reactance elements $X_1$, $X_2$, $X_3$ being so selected that for the electrical phase difference $\phi_E$, the following conditions are met:

$$\left(\frac{X_1}{X_2} + 1\right) \cdot (1 - \omega_o C_2 X_3) - \omega_o C_2 X_1 = \cos \phi_E$$

-continued $$\left(\frac{X_1}{X_2} + 1\right) \cdot G_2 X_3 + G_2 X_1 = \sin \phi_E$$

$X_2 \neq 0$
where $\omega_o = 2\pi f_o$ $f_o$: center frequency of the surface acoustic wave device
$G_2$: radiation conductance of the sending part
$C_2$: electrical capacitance of the sending part.

10. A surface acoustic wave (SAW) device, comprising: a piezo-electric surface acoustic wave substrate; an input transducer formed on said substrate and connected to a signal source, for conversion of an electrical signal from said signal source into a surface acoustic wave; an output transducer formed on said substrate and connected to a load circuit, for conversion of said acoustic wave into said electric signal; at least one of said input transducer and said output transducer including a second electrode and a reflecting electrode; a phase shifter provided between said sending electrode and said reflecting electrode for producing electrically a phase difference therebetween; said device satisfying the following conditions:

$$Ga \neq Gs, a \neq 0$$

at a center frequency of a frequency band; and $$a = \frac{Gs - Ga}{GS - Ga}$$

at a band frequnecy except for said center frequency; where a represents the ratio of energy radiated from said output transducer toward said input transducer to the energy radiated from said input transducer to said output transducer, Ga represents a composite conductance of said phase shifter and said transducer which include said phase shifter and said transducer which include said sending electrode and said reflecting electrode, and Gs represents a source conductance externally coupled to said input transducer.

* * * * *